(12) United States Patent
Baik et al.

(10) Patent No.: US 6,652,762 B2
(45) Date of Patent: *Nov. 25, 2003

(54) METHOD FOR FABRICATING NANO-SIZED DIAMOND WHISKER, AND NANO-SIZED DIAMOND WHISKER FABRICATED THEREBY

(75) Inventors: Young Joon Baik, Seoul (KR); Eun Song Baik, Chunan (KR); Dong Ryul Jeon, Yongin (KR)

(73) Assignee: Korea Institute of Science and Technology, Seoul (KR)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/412,536

(22) Filed: Oct. 5, 1999

(65) Prior Publication Data

US 2003/0052080 A1 Mar. 20, 2003

(30) Foreign Application Priority Data

Jan. 27, 1999 (KR) .......................................... 1999-2551
May 25, 1999 (KR) ........................................ 1999-18825

(51) Int. Cl.⁷ ....................... C03C 15/00; H01L 21/302; H01L 21/3065
(52) U.S. Cl. ........................ 216/41; 438/709; 438/710; 438/712
(58) Field of Search .......................... 216/41; 438/105, 438/710, 712, 709

(56) References Cited

U.S. PATENT DOCUMENTS

| 4,957,591 A | | 9/1990 | Sato et al. ................... 156/345 |
| 5,514,603 A | * | 5/1996 | Sato ........................... 438/105 |
| 5,888,846 A | * | 3/1999 | Miyata et al. ............... 438/105 |

OTHER PUBLICATIONS

"The Materials Science of Thin Films", by Milton Ohring, Academic Press, Inc., pp. 195–219.
"Synthesis of Large Arrays of Well–Aligned Carbon Nanotubes on Glass", by Z.F. Ren, et al., Science, vol. 282, Nov. 6, 1990, pp. 1105–1107.
"A Thin–Film Field–Emission Cathode", by C. A. Spindt, Journal of Applied Physics, vol. 39, pp. 3504–3505.

* cited by examiner

Primary Examiner—Robert Kunemund
Assistant Examiner—Lynette T. Umez-Eronini
(74) Attorney, Agent, or Firm—Scully, Scott, Murphy & Presser

(57) ABSTRACT

A method for fabricating a nano-sized diamond whisker includes the steps of depositing a diamond film on a substrate, forming a nano-sized mask pattern on the deposited diamond film, and etching the diamond film by using the nano-sized pattern as an etching mask. The nano-sized diamond whisker can be used as a new field emission cold cathode device, thereby advancing a practical use of a field emission device having high performance, and can also be applied to various fields such as a new composite material and a mechanical device.

9 Claims, 7 Drawing Sheets

METHOD FOR FABRICATING NANO-SIZED DIAMOND WHISKER, AND NANO-SIZED DIAMOND WHISKER FABRICATED THEREBY

BACKGROUND OF THE INVENTION

1. Field of the Invention

The present invention relates to a method for fabricating a nano-sized diamond whisker, and in particular a nano-sized diamond whisker which can be applied to a highly efficient cold cathode device and to a composite material, by fabricating a surface of diamond or a whole diamond, the diamond which is formed in a film or a particle, in a nano-sized whisker by a plasma etching process.

2. Description of the Background Art

In general, diamond has the following mechanical properties; the highest hardness, the highest thermal conductivity among existing materials, a low thermal expansion coefficient, a superior electrical resistance, a chemical resistance property, a radiation resistance property, an excellent semi-conductivity, and a superior negative electron affinity, and thus the application scope thereof is considerably wide. Especially, the development of a composite material using the thermal and mechanical properties of diamond is very significant in a composite material requiring good mechanical properties (Materials for electronic packaging, D. D. L. Chung, part III, Butterworth-Heinemann, USA(1995)).

However, in order to fabricate a diamond composite material, the diamond must be fabricated in a whisker or a fiber form. The current technology can only fabricate diamonds in the form of a film or a powder (Synthetic Diamond, ed. by K. E. Spear and J. P. Dismukes, John Wiley and Sons, Inc., N.Y., USA(1994)).

When a diamond is fabricated in a whisker or fiber form, the main application is a cold cathode for a field emission device. The cold cathode for the field emission device serves to emit electrons in a field emission flat display panel, a vacuum semiconductor device, a microwave device and the like. Diamond has been recognized as an ideal material for cold cathode due to its negative electron affinity. However, it is difficult to fabricate a diamond in a proper shape, and thus it is not practically useful. If a diamond can be fabricated in a whisker form which can focus an electric field to a cathode portion, it is possible to fabricate a device with remarkably superior field emission performance and durability, as compared with a Spindt-shaped Si or Mo cold cathode (C. A. Spindt, J. Appl. Phys., 39, 3504(1968)) which is being currently used, or a carbon nano-tube (Z. F. Ren et al., Science, 282, 6, November, 110(1998)) which is currently noteworthy.

As disclosed in U.S. Pat. No. 4,957,591, there is a technique of fabricating a diamond crystal particle in a polygonal cone shape. According to this method, polygonal cone-shaped diamond particles are separated by selectively etching a grain boundary between crystals of a polycrystalline diamond film having a polygonal cone-shaped structure by a chemical reaction. The diameter of the polygonal cone-shaped diamond to be fabricated after the etching process is dependent upon the size of the particles composing the diamond film. As the diameter of the polygonal cone-shaped diamond particles composing the diamond film is over a few $\mu m$, the diameter of the diamond fabricated by the selective etching process is over 1 to 2 $\mu m$. In addition, the diameter of the polygonal cone-shaped diamond increases from narrow to wide, and thus it is impossible to fabricate a bar-shaped diamond having a constant diameter. This technique employs the selective etching process of the grain boundaries of the diamond film, and thus the possibility of fabrication is determined by the microstructure of the diamond film used. When the diamond film is synthesized, its microstructure must be precisely controlled. As a result, the bar-shaped diamond having a diameter equal to or less than 1 $\mu m$ cannot be fabricated by the above-described method. The etching pressure is considerably high, about 1 to 200 torr, and thus a large sized diamond cannot be regularly etched. The deposition temperature is also high, about 400 to 1000° C., and thus only a specific kind of substrate can be employed for deposition of the diamond film, and the diamond may be transformed into graphite. Since the bar-shaped diamond having a constant diameter cannot be fabricated, an application scope thereof is also limited. Further, even if the grain boundaries of the polycrystalline diamond film are selectively etched, it is impossible to fabricate a nano-sized diamond whisker having a constant diameter.

As described above, there is no known method for fabricating a diamond whisker having a constant nano-sized diameter, and thus a technique of fabricating a product utilizing a nano-sized diamond whisker has never been suggested.

SUMMARY OF THE INVENTION

Accordingly, it is an object of the present invention to provide a diamond whisker having a constant nano-sized diameter, and to provide a method by which the nano-sized diameter whisker can be fabricated in large area units at a low temperature, by using a real time mask and an anisotropic etching property of diamond.

In order to achieve the above-described objects of the present invention, there is provided a method for fabricating a nano-sized diamond whisker comprising the steps of: depositing a diamond film on a substrate; forming a nano-sized pattern on the deposited diamond film; and etching the diamond film by using the nano-sized pattern as an etching mask. The pattern may be grown and formed on the diamond film in the shape of an island or a Stranski-Krastanov type. In addition, a material reacted with plasma or ions at a reactive chamber wall or a substrate supporting unit may be deposited on the substrate, and then the nano-sized diamond whisker may be fabricated by using the deposited material as a mask. A reactive plasma or reactive ion beam is used in the step of etching the diamond film.

BRIEF DESCRIPTION OF THE DRAWINGS

The present invention will become better understood with reference to the accompanying drawings which are given only by way of illustration and thus are not limitative of the present invention, wherein.

DETAILED DESCRIPTION OF THE INVENTION

Figure 1A:
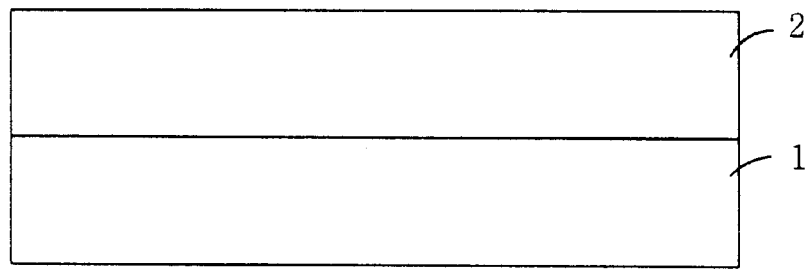
FIGS. 1a to 1c are cross-sectional views illustrating sequential steps of a method for fabricating a nano-sized diamond whisker in accordance with the present invention.
Figure 1B:
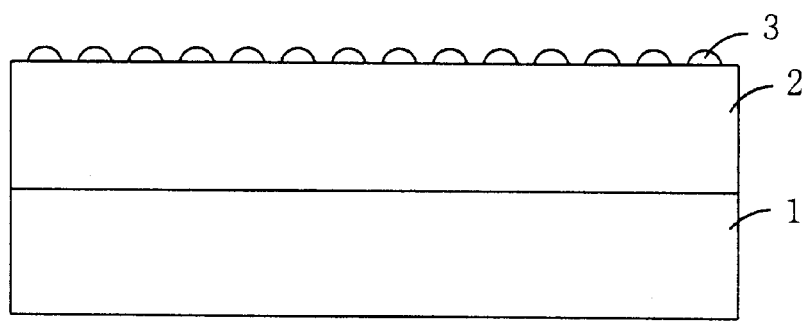
Figure 1C:
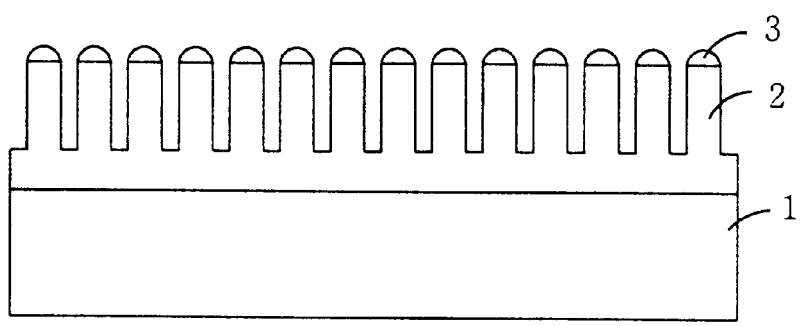

FIGS. 1a to 1c are cross-sectional views illustrating sequential fabricating steps of a nano-sized diamond whisker in accordance with the present invention. FIG. 1a illustrates a step of preparing a diamond film 2 to be used for fabricating the nano-sized whisker on a substrate 1, FIG. 1b illustrates a step of forming a nano-sized mask 3 on the diamond film 2, and FIG. 1c illustrates a step of etching the diamond film 2 exposed at the sides of the nano-sized mask 3 by using the nano-sized mask 3 as an etching mask.

Figure 2A:
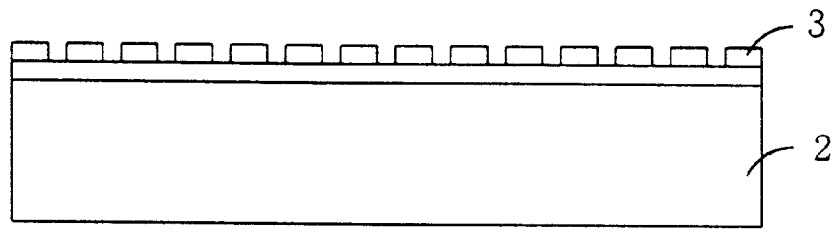
FIGS. 2a and 2b are cross-sectional views illustrating sequential steps of a method for forming a mask by using a general photolithography technique.
Figure 2B:
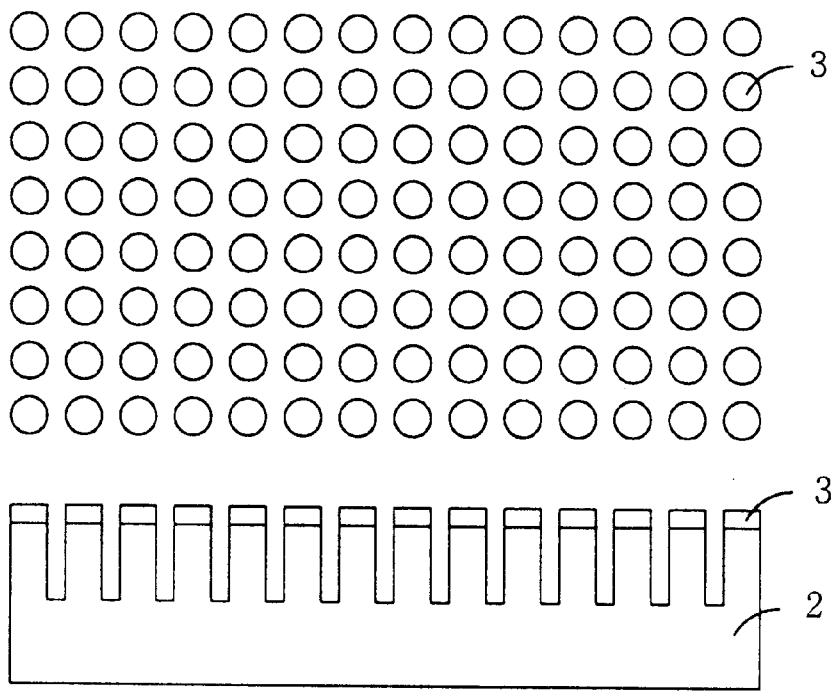

FIGS. 2a and 2b illustrate sequential steps of forming a mask by utilizing a photolithographic technique generally used in a semiconductor fabrication process. First, a film for a mask is formed by depositing a metal such as Mo, W or Al, or an oxide such as silicon oxide, or a nitride. A pattern is formed by spreading a photoresist on the film, and by exposing and developing the film by using a mask fabricated in a predetermined shape (FIG. 2a). Thereafter, a pattern 3 is formed by using the pattern of the photoresist as an etching mask, and by etching the mask film. After the photoresist pattern is removed, the diamond film 2 is etched by employing the pattern 3 as the etching mask, using a reactive plasma or a reactive ion beam. Deep grooves are formed in the diamond film by the etching process (FIG. 2b). However, it is very difficult to form a pattern less than 1 μm by the general photolithography method using the mask. Thus, the present invention provides a real time mask process employing an island growth (thin film growth by forming a nucleus in an island shape) or a Stranski-Krastanov growth (three-dimensional uneven thin film growth) in depositing the mask film, thereby reducing the size of the mask pattern to a nanometer scale.

The method for fabricating the nano-sized diamond whisker in accordance with the present invention will now be described in detail.

First, a diamond layer 2 is formed on a substrate 1 in any shape, such as a thin film, a thick film, a plate, a single crystal or a particle (FIG. 1a). In this case, silicon, glass or metal may be used as a material of the substrate 1.

Next, as shown in FIG. 1b, a mask 3 having a nano-sized pattern is formed on the diamond layer 2. In general, when a thin film is deposited on a different type of substrate, the island growth phenomenon or the Stranski-Krastanov growth phenomenon is required (Milton Ohring, The Materials Science of Thin Films, Academic Press, chapter 5, p195 (1992)). FIGS. 3a–3b and 4a–4b illustrate processes of fabricating a nano-sized mask by using these two growth methods, respectively.

In the case a different type of film is deposited on the diamond layer, at an initial stage of nucleation, the shape and the size of the nucleus are determined by the interface energy between the deposited film and the diamond layer and atom mobility on the surface. Whether the nucleus is grown as an island shape or a Stranski-Krastanov shape is determined by the relative magnitude of the interface energies. When a different film is deposited on the diamond film, three interfaces are involved, a diamond surface, a deposited film surface, and an interface between the diamond layer and the deposited film. In a deposition step, the surface of the diamond layer is combined with the surface of the different type of film, thereby forming the interface layer therebetween. The nucleation growth type of the deposited film is determined by the relative magnitude of the interface energies. If the interface energy between the diamond layer and the deposited film is relatively low, the entire interface energy is lowered due to the formation of the interface, and thus the deposited film is in a lenticular form which is widely spread on the diamond layer surface, or in a continuous film. In the case the interface energy is relatively high, the shape of the deposited film is determined to reduce the area of the interfaces. As a result, the deposited film is in an island shape like water drops. In order to form an island-shaped mask, it is necessary to select a material having a high interface energy between a diamond and the deposition film. On the other hand, the size of the islands is determined by two variables. First is the deposition time. The longer the deposition time, the bigger the size of the islands. As a result, the islands impinge to form a continuous film. The second variable is the deposition temperature. As the temperature increases, the mobility of atoms deposited on the diamond layer increases. Even for the same deposition time, the islands increase in size due to the increased temperature. The size of the islands is determined by controlling these two variables. When the size of the islands increases and they combine with each other to form a continuous film, the surface of the film is uneven.

Accordingly, the deposition film is selected so that the islands can be water drop-shaped, and the shapes of the islands are maintained due to the low mobility of the deposition material during etching. The higher the melting point, the less the mobility of the atoms. In this regard, it is advantageous to employ a high melting point metal, such as Mo or W, as the deposited film. However, in the case of different types of films, a preferred effect can be achieved by controlling the deposition temperature and time, or setting the appropriate conditions.

According to the present invention, the nano-sized pattern can be fabricated without fabricating a special mask for the photolithography or performing the photolithography with a photoresist. In order to employ a pattern according to the selective lithographic process generally used in the semiconductor fabrication process, a patterned mask for the photolithography is required. Using the mask, the pattern can be employed by the photolithography of a photoresist. However, it is impossible to fabricate the nano-sized diamond whisker by the current technology of the semiconductor fabrication process. In addition, the film deposition in accordance with the present invention has never been used for embodying the nano-sized shaped diamond whisker. Accordingly, the present invention is novel in that the film deposition is applied to the nano-sized mask, and further to the fabrication of the nano-sized diamond whisker.

On the other hand, the present invention remarkably simplifies a method for fabricating the nano-sized diamond whisker by employing a real time mask fabrication process. Here, the real time mask fabrication process is a process of forming a specific shape of the deposited film as a mask for lithography, without preparing additional masks for photolithography and removing the photoresist as generally used in the conventional semiconductor fabrication process.

Figure 3A:
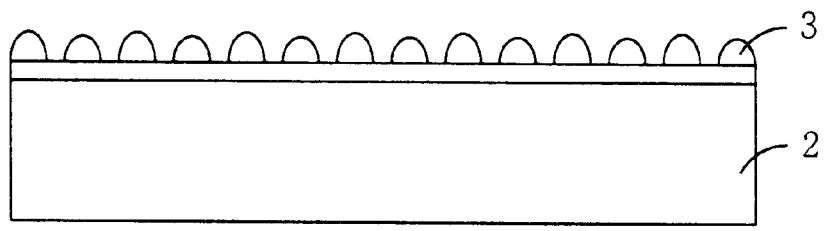
FIGS. 3a and 3b are cross-sectional views illustrating sequential steps of a method for forming a nano-sized mask by using an island growth technique.
Figure 3B:
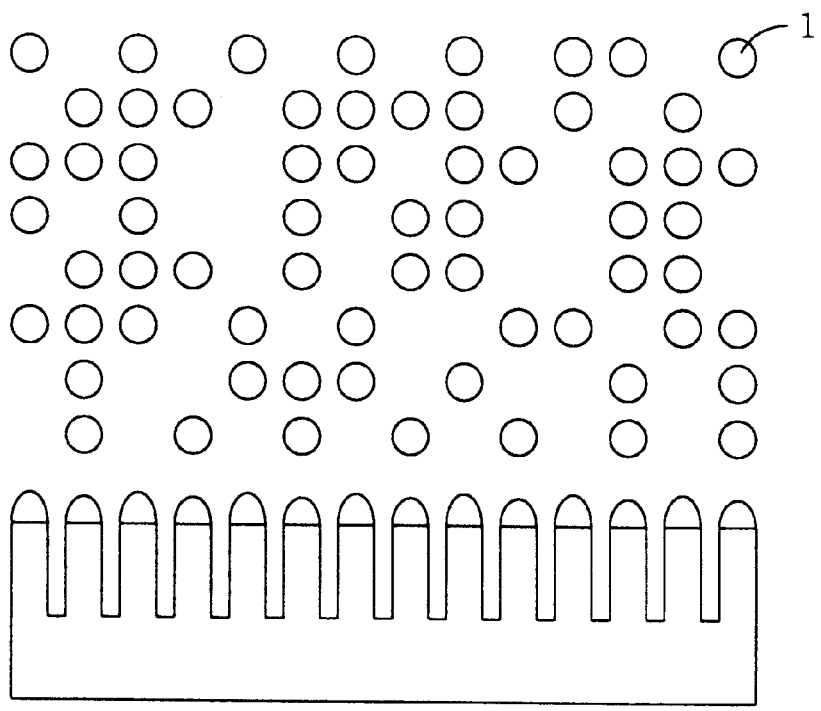

FIGS. 3a and 3b illustrate the island growth phenomenon. In this case, a thin film grows as the nuclei are separated. Here, the size of each nucleus is a few to a few tens of nanometers, and thus the nano-sized pattern for a mask can be formed. When the nano-sized pattern 3 is formed on the diamond layer 2 (FIG. 3a) and a strong anisotropic etching process is performed on the diamond layer, the diamond layer around the pattern 3 is etched. Thereby whiskers having a diameter corresponding to the nano-sized pattern 3 can be fabricated.

The nano-sized pattern 3 for a mask may be formed by depositing on the substrate a material sputtered at an initial stage of the reaction in a plasma chamber or a substrate supporting unit, without requiring a special thin film growth process.

Figure 4A:
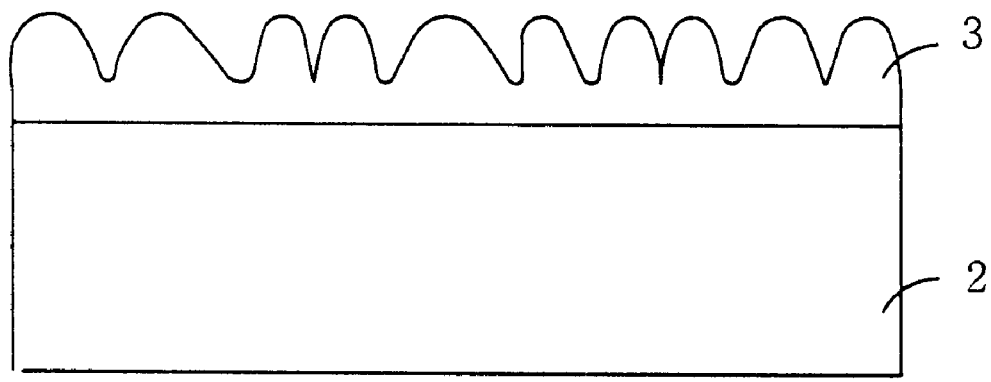
FIGS. 4a and 4b are cross-sectional views illustrating sequential steps of a method for forming a nano-sized mask by using a Stranski-Krastanov growth technique.
Figure 4B:
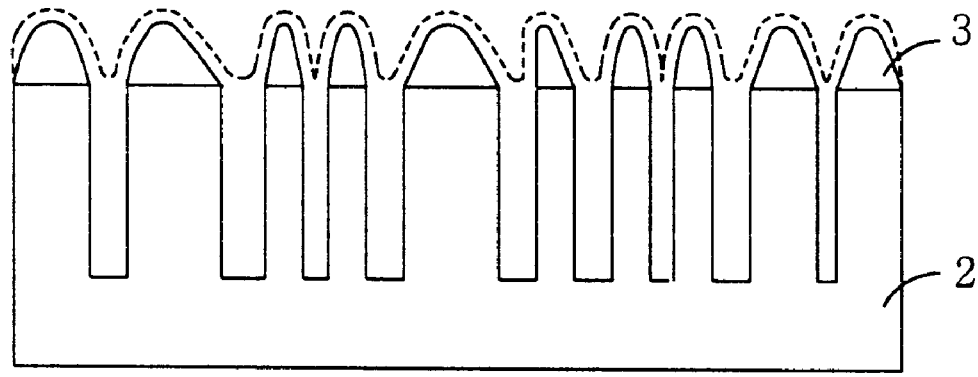

FIGS. 4a and 4b illustrate the Stranski-Krastanov growth type process. In this case, the thin film is formed not in a regular island shape but in an uneven pattern 3 (FIG. 4a). When the uneven pattern is etched, the pattern 3 is etched to a specific depth. Accordingly, the diamond layer is exposed which is positioned at a lower portion of a region corresponding to the grooves in the pattern. When the diamond layer 2 is partially exposed, a reactive etching process is carried out on the diamond layer 2 exposed around the pattern 3 by using a peak portion of the pattern 3 as the mask. Here, the size of the peak portion of each pattern is a few to a few tens nanometers, and thus the nano-sized diamond whiskers can be formed (FIG. 4b).

After the nano-sized pattern 3 for the mask is fabricated as described above, a strong anisotropic etching process is performed on the diamond layer 2 exposed around the pattern by using the pattern 3 as an etching mask, and by employing a reactive plasma or a reactive ion beam. As a result, the nano-sized diamond whisker etched in a vertical direction to the surface is formed.

A reactive plasma, such as radio-frequency plasma, a magnetic field enhanced radio-frequency plasma, a microwave plasma, and an electro-cyclotron resonance plasma may be used for embodying the strong anisotropic etching process. In addition, the substrate 1 is biased negatively, thereby facilitating the anisotropic etching process.

The method for fabricating the nano-sized diamond whisker in accordance with the preferred embodiments of the present invention will now be described in more detail.

EXAMPLE 1

Figure 5:
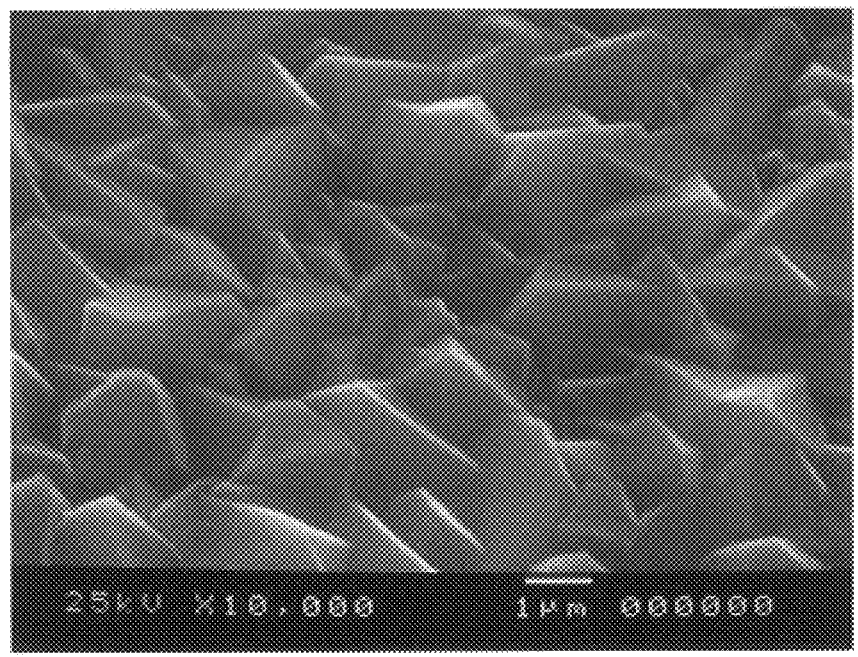
FIG. 5 is an electron microscope photograph of a surface of a diamond film deposited on an Si substrate.
Figure 6:
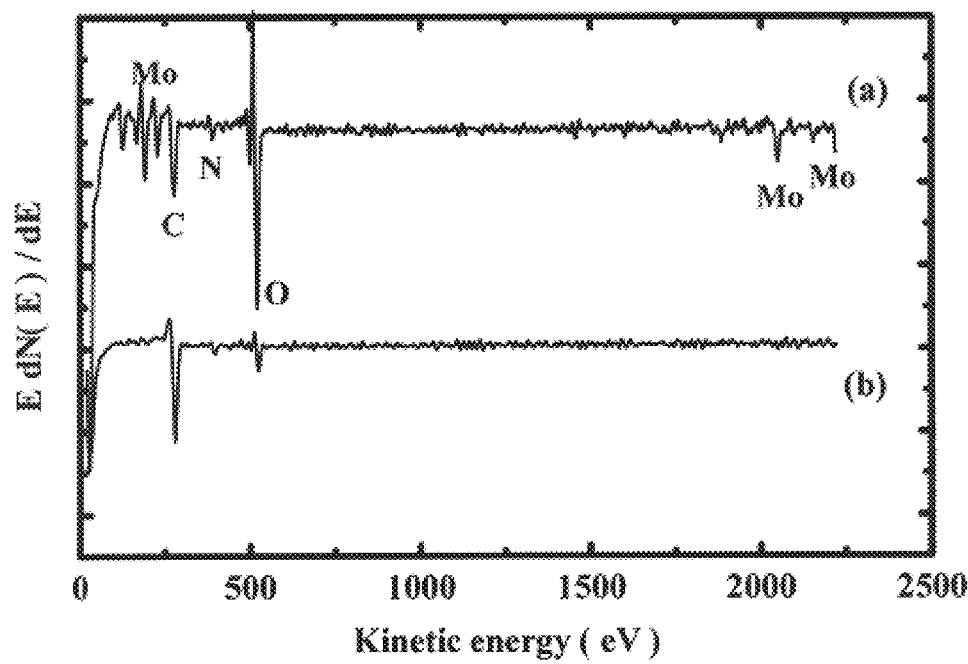
FIG. 6 is a graph showing an Auger electron spectrum analysis result analyzing that Mo is deposited on a surface of the diamond film, where spectrum(a) and (b) correspond to whisker-formed area and non-formed area, respectively.

FIG. 5 is an electron microscope photograph illustrating a diamond film deposited on a silicon substrate. A silicon wafer having a diameter of 4" was used as the substrate. The surface of the substrate was polished by using a diamond powder of less than 0.5 $\mu$m particle size. The polished substrate was washed with acetone by supersonic waves. Thereafter, the diamond film was deposited on the washed substrate for 5 hours by a hot filament chemical deposition method, under the conditions of 40 torr synthesizing pressure, 1060° C. substrate temperature, 2100° C. filament temperature, and 5% $CH_4$—$H_2$ gas composition. Mo was coated on the diamond film for approximately 5 seconds by sputtering. Here, the thickness of the Mo coating was approximately 30 Å. It was expected that the coated Mo exists on an upper portion of the diamond film 2 in very small clusters or island shapes. The shape of the deposited Mo could not be distinguished by a scanning electron microscope. However, it was confirmed by Auger Electro Spectroscopy that Mo was deposited on the diamond film 2 as shown in FIG. 6. On the other hand, according to an analysis, after a surface layer of the Mo coating was removed by sputtering, the Mo coating was confirmed to be entirely removed.

Thereafter, the diamond whiskers were formed by etching for one and a half hours the diamond film where the clusters or islands of Mo were formed, by employing a reactive plasma formed of a nitrogen-20% oxygen mixture gas under the conditions of 300W of high frequency power, 10 mtorr pressure and a 60 Gauss magnetic field which was horizontal to the substrate.

Figure 7:
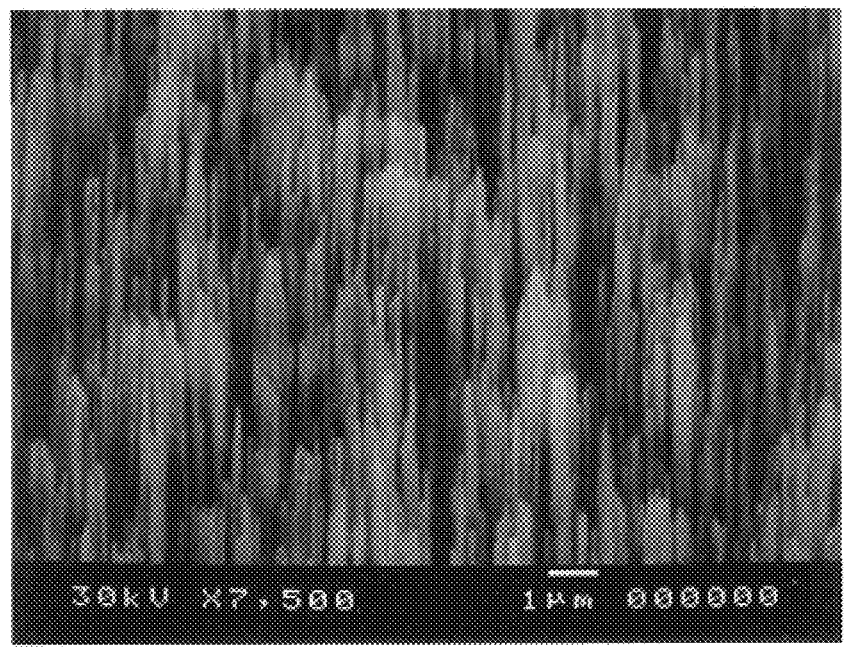
FIG. 7 is an electron microscope photograph of a nano-sized whisker formed by etching the diamond film in FIG. 5 under the process conditions of the present invention.

FIG. 7 is an electron microscope photograph of the diamond whisker formed by depositing and etching Mo on the diamond film 2 as shown in FIG. 5. The diamond whisker was formed to have a diameter of a few tens nm. It was inferred that a fiber having a diameter less than a micron could be formed, regardless of the particle size of the diamond film, considering that the size of the surface particles of the diamond film was a few Am. Here, the diamond film was etched from the initial stage of the etching process.

Figure 8:
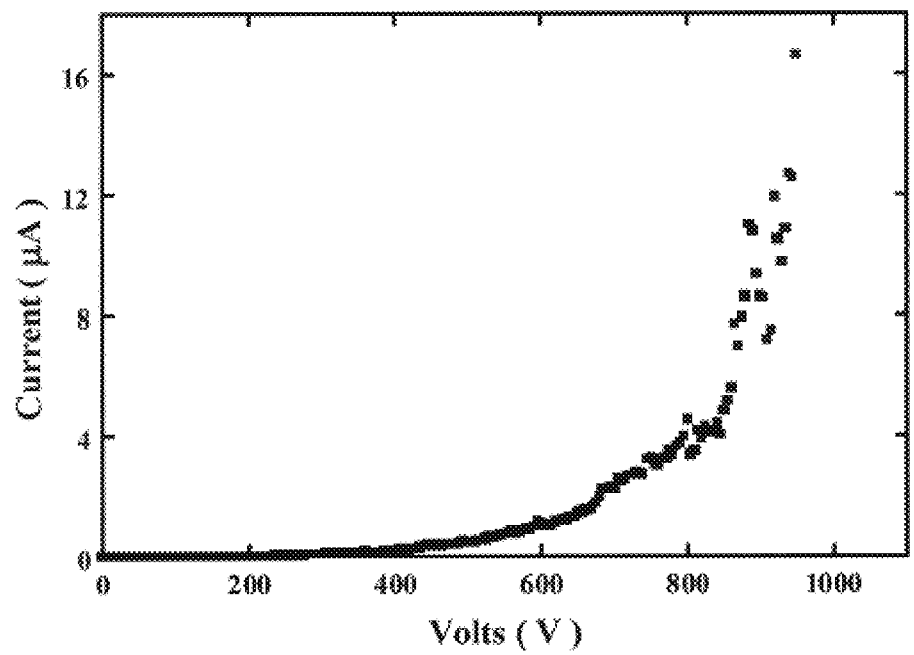
FIG. 8 is a graph showing a field emission current-voltage characteristic of the nano-sized diamond whisker of FIG. 6.

FIG. 8 is a graph showing a field emission characteristic of the diamond whisker as illustrated in FIG. 7. As shown therein, it was measured by etching the diamond whisker for 5 minutes by using a hydrogen plasma to remove a graphite layer formed on the surface, and maintaining an interval among the electrodes at 150 $\mu$m at $10^{-7}$ torr of vacuum. The electron discharge was started at 2V/$\mu$m, and the electron discharge of a few tens $\mu$A is shown. The electron discharge is sensitive to the hydrogen plasma processing, and is varied from a few to a few hundreds $\mu$m.

EXAMPLE 2

Figure 9:
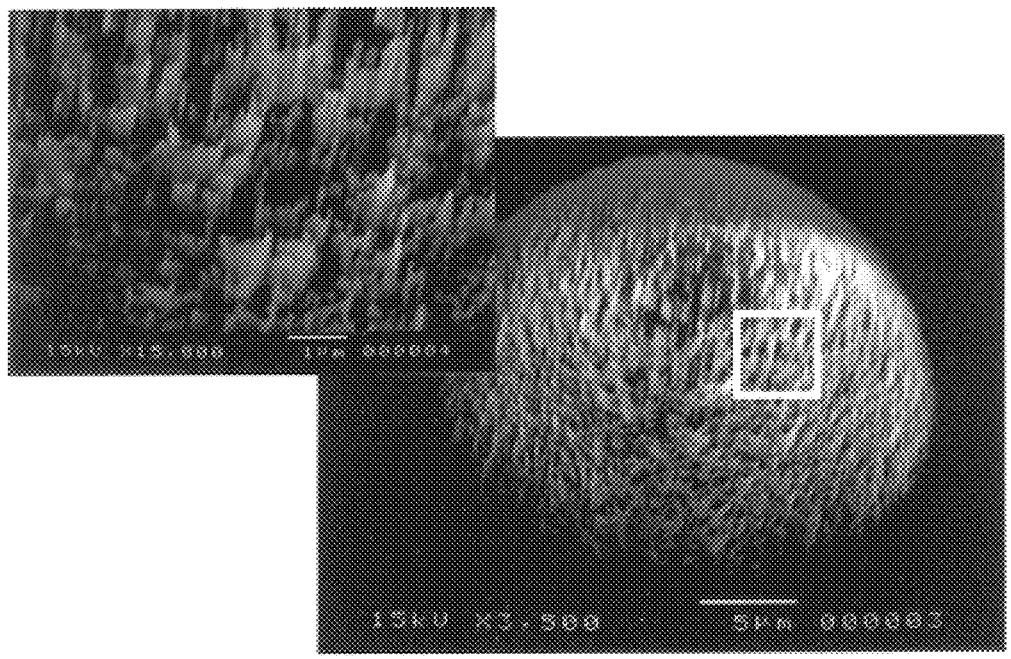
FIG. 9 is an electron microscope photograph of a surface of a particle consisting of whiskers obtained by etching a diamond particle formed by vaporized synthesis, under the process conditions of the present invention.

According to another example of the present invention as shown in FIG. 9, in the case of a diamond particle formed by vaporized synthesis, Mo was deposited on the diamond particle as described above in example 1, and the reactive etching process was carried out thereon. The experiment conditions were identical to example 1, but the etching time was 40 minutes. As shown in the enlarged photograph, the surface of the diamond particle shows that the whisker was well-formed.

EXAMPLE 3

Figure 10:
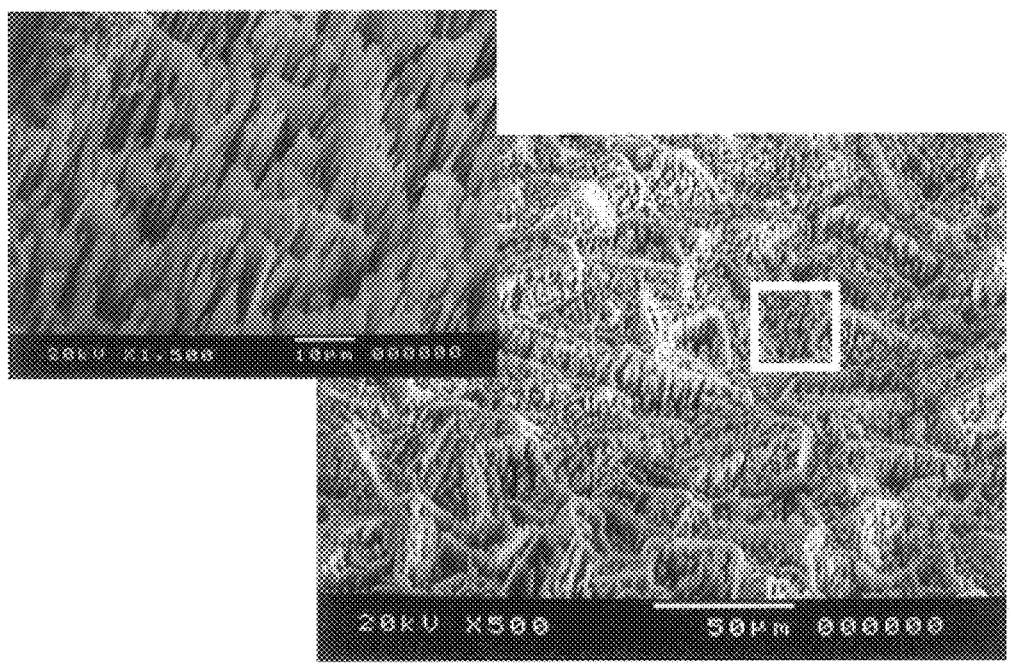
FIG. 10 is an electron microscope photograph of a surface of a particle consisting of whiskers obtained by etching a diamond particle formed by a supervoltage synthesizing method, under the process conditions of the present invention.

FIG. 10 depicts an etched diamond particle synthesized by high temperature high pressure method. It was identically processed as described above in example 1. The etching time was 4 hours. It is shown that the surface of the diamond particle was whisker-shaped.

EXAMPLE 4

The etching effect was achieved by forming a deposited film in a continuous shape by the Stranski-Krastanov growth technique by increasing the deposition time of Mo. Mo was deposited for 60 seconds under the same conditions as in example 1. The thickness of the consecutive Mo film was approximately 360 Å, and the surface roughness thereof was approximately 30 Å. Although the etching process was performed under the same conditions, the diamond film was not etched at the initial stage. It was confirmed that the diamond film started to be etched after 10 minutes. This implied that Mo was necessary. Once the diamond film was partially exposed, the diamond film was etched. After the etching process was finished, it was confirmed by electron microscope that Mo remained at the upper portion of the whisker. Here, the size of the whisker was more or less greater compared with example 1.

The nano-sized diamond whisker in accordance with the present invention can be variously applied. It can be applied as a field emission cold cathode device in a new shape, thereby advancing a practical use of a field emission device having high performance. In addition, it is expected to provide a new material, namely to design and synthesize a new material together with polymers, metals and ceramics. Such a material can be possibly actively applied to, as an example a semiconductor package material. It is also possible to form a surface layer of amorphous diamond, like an amorphous silicon, and thus the material can be applied as an optical emitting material. When a composite material together with metal and the like is composed of a whisker or needle formed on the surface of the diamond powder, an adhesive force of its interface is considerably improved, which results in an improved mechanical performance of a mechanical device using the diamond powder.

As the present invention may be embodied in several forms without departing from the spirit or essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within the metes and bounds of the claims, or equivalencies of such metes and bounds are therefore intended to be embraced by the appended claims.

What is claimed is:

1. A method for fabricating a nano-sized diamond whisker, comprising the steps of:
    depositing a diamond film on a substrate;
    forming a nano-sized pattern on the deposited diamond film directly, without any post-processing, the nano-sized pattern being formed and grown on the diamond film in one of (a) an island shape, and (b) a Stranski-Krastanov growth pattern; and
    etching the diamond film by using the nano-sized pattern as an etching mask.

2. The method according to claim 1, wherein the pattern is formed by depositing on the substrate a material reacted with plasma or ions in a reactive chamber or a substrate supporting unit.

3. The method according to claim 1, wherein the nano-sized pattern is formed of one of metal, silicon oxide or nitride.

4. The method according to claim 3, wherein the metal is either Mo or W.

5. The method according to claim 1, wherein the diamond film is etched by using a reactive plasma.

6. The method according to claim 5, wherein a negative bias is applied to the substrate during etching with the reactive plasma.

7. The method according to claim 5, wherein the reactive plasma is selected from the group consisting of a radio-frequency plasma, a magnetic field enhanced radio-frequency plasma, a microwave plasma, and an electro-cyclotron resonance plasma.

8. The method according to claim 1, wherein the diamond film is etched by using a reactive ion beam.

9. A nano-sized diamond whisker fabricated by depositing a diamond film on a substrate, and forming a nano-sized pattern on the diamond film directly, without any post-processing, in one of (a) an island shape, and (b) a Stranski-Krastanov growth pattern.

* * * * *

UNITED STATES PATENT AND TRADEMARK OFFICE
CERTIFICATE OF CORRECTION

PATENT NO. : 6,652,762 B2
DATED : November 25, 2003
INVENTOR(S) : Young Joon Baik et al.

It is certified that error appears in the above-identified patent and that said Letters Patent is hereby corrected as shown below:

Title page,
Item [73], Assignee, should read as follows:
-- Korea Institute of Science and Technology, Seoul (KR)
 Myoung Ji University, Kyunggi-Do (KR) --

Signed and Sealed this

Twenty-second Day of June, 2004

JON W. DUDAS
*Acting Director of the United States Patent and Trademark Office*